United States Patent [19]

Komoriya

[11] 4,341,961
[45] Jul. 27, 1982

[54] DISCRIMINATION APPARATUS FOR EXTRACTING MAXIMUM-VALUE OUTPUT FROM A PLURALITY OF SIGNALS AND INDEXING THE RELEVANT CHANNEL

[76] Inventor: Kiyoshi Komoriya, 3-2 Kami-Kitazawa 3 chome, Setagaya-ku, Tokyo, Japan

[21] Appl. No.: 125,993

[22] Filed: Feb. 29, 1980

[30] Foreign Application Priority Data

Mar. 3, 1979 [JP] Japan ................................ 54/24819

[51] Int. Cl.³ ............................................. H03K 5/24
[52] U.S. Cl. ................................. 307/355; 307/357; 307/362; 307/311; 328/137; 328/148
[58] Field of Search ............... 307/311, 351, 355, 356, 307/357, 362; 328/137, 147, 148, 154; 250/551

[56] References Cited
U.S. PATENT DOCUMENTS 3,619,791 11/1971 Moreines .......................... 307/357
3,895,237 7/1975 Harr ................................. 307/351
4,177,413 12/1979 Ascoli ............................. 307/311

Primary Examiner—John Zazworsky
Attorney, Agent, or Firm—Kurt Kelman

[57] ABSTRACT

A channel discrimination apparatus comprises a plurality of photocouplers each consisting of an electroluminescent element and a photoelectric element, and transistors, whereby the extraction of the potential of the signal of the maximum potential is effected by means of an OR circuit formed by connection of the output terminals of the electroluminescent elements and the indexing of the channel transmitting the signal of the maximum potential is effected by virtue of the signal issued from the output terminal of the particular transistor which produces a switching action on reception of the bias signal in consequence of the operation of the corresponding photoelectric element to be produced in response to the emission of light from the corresponding electroluminescent element.

1 Claim, 3 Drawing Figures

DISCRIMINATION APPARATUS FOR EXTRACTING MAXIMUM-VALUE OUTPUT FROM A PLURALITY OF SIGNALS AND INDEXING THE RELEVANT CHANNEL

BACKGROUND OF THE INVENTION

This invention relates to a discrimination apparatus for extracting the maximum-value output from the electric signals being transmitted through a plurality of channel circuits and indexing the relevant channel transmitting the electric signal of the maximum value.

In the field of neuropsychology, for example, studies are conducted to elucidate the mechanism of the nervous system useful for discrimination learning. In one such study, the activities at all the parts of the nervous system are analyzed in accordance with the data obtained by numerous sorts of examinations and numerous experiments are carried out for the elucidation of the functions of the brain in connection with the faculties of language, exercise and memory. In experiments of this nature, necessary information is generally obtained by fastening electrodes at a suitable plurality of positions such as on the brain, the central nervous and the muscles and causing various electric potentials extracted via these electrodes to be delivered as input signals to the learning machine, there to be subjected to proper processing. This technique is applicable not only to such laboratory experiments but also to the control of the operation of artificial arms involving the use of myoelectric potentials (EMG) as instruction signals and to the automatic control of machine tools.

Incidentally concerning the analysis of information in the learning machine, the input unit responsible for the delivery of incoming information to this machine is required to discriminate from among the plurality of electrodes the particular electrode extracting the potential signal of the maximum value and, further, extract the maximum potential of the signal. For this purpose there has heretofore been generally adopted the method which effects the discrimination of the signal of the maximum potential by comparative correlation of the individual signals from the plurality of electrodes and, by means of circuits independently serving the aforementioned plurality of electrodes, accomplishes the indexing of the particular electrode which has extracted the electric potential of the maximum value.

A simple circuit system available for the extraction of the maximum potential is composed in the form of an OR circuit by parallelly connecting a plurality of diodes, for example. This system makes use of the phenomenon that in the particular diode through which the input signal of the maximum potential passes, the maximum potential functions as a reverse bias relative to the remaining diodes. This circuit system, when used alone, is incapable of discriminating from among the diodes the particular diode which has passed the maximum potential. For this circuit system to permit the discrimination effectively, therefore, it is necessary to provide all the diodes respectively with independent circuits specifically adapted for the purpose of discrimination, to furnish the diodes with means capable of performing necessary time-division processing or to incorporate into the system means capable of performing arithmetic operations based on the discriminant functions established in advance. Performance of such complicated processing necessitates use of a fairly complicated circuit system. This inevitable necessity often deprives the technique of its applicability to artificial arms and machine tools.

An object of this invention, therefore, is to provide a discrimination apparatus of simple circuit configuration, which apparatus extracts the maximum potential from the input signals being transmitted through a circuit incorporating a plurality of input channels and, at the same time, indexes the channel in which the aforementioned maximum potential has been extracted.

SUMMARY OF THE INVENTION

To accomplish the object described above according to the present invention, there is provided a discrimination apparatus for extracting the maximum potential from the input electric signal and indexing the channel transmitting the electric signal having the maximum potential, which discrimination apparatus comprises as many photocouplers as input channels in use, the photocouplers each formed of an electroluminescent device and a photoelectric device adapted to operate in response to emission of light from the electroluminescent device, the electroluminescent devices having the output ends thereof connected integrally to form an OR circuit, and switch means adapted to function independently in response to the individual outputs of the photoelectric devices.

The output of the OR circuit composed of the electroluminescent devices is the electric potential of the maximum value extracted by one of the plurality of channels in use. Only the one of the electroluminescent diode which is transmitting the potential signal of the maximum value is allowed to emit light and the corresponding one of the photoelectric devices is consequently actuated to output the discriminating signal from the relevant one of the channels. On this principle, the discrimination apparatus of this invention is capable of simultaneously fulfilling the functions of extracting the intensity of the electric potential of the maximum value and discriminating the particular channel which has transmitted this electric potential.

In the classification of a plurality of categories fixed in the form of modes of motions for the control of an artificial arm by the discrimination of myoelectric potentials extracted as instruction signals at a plurality of positions such as in the region of the shoulder, for example, one pair of circuits of the aforementioned configuration are arranged in a parallel connection, with one of the two circuits serving as the main circuit and the other circuit as the auxiliary circuit respectively. Then, the output of the main circuit is caused to pass through an inverter and used as the signal for actuating the switch on the input side of the auxiliary circuit. Consequently, the potential signal of the second largest value can be obtained from the output of the auxiliary circuit. The signal of the maximum value from the main circuit is compared with the potential signal of the second largest value from the auxiliary circuit with respect to the reference level and, that is when the ratio of the second largest value from the auxiliary circuit to the maximum value from the main circuit is smaller than the preset reference level, the signal of the maximum value from the main circuit is forwarded from the independent output terminal for further processing. In this manner, effective discrimination of the signal of the maximum value can be accomplished with high reliability from a multiplicity of categories involved.

The other objects and characteristics of the present invention will become apparent from the further disclosure of the invention which is made hereinafter with reference to the accompanying drawing.

DESCRIPTION OF THE PREFERRED EMBODIMENTS

This invention relates to a discrimination apparatus which is capable of simultaneously extracting the signal having the maximum value from the electric signals being transmitted through a plurality of channels in a circuit and permitting easy indexing of the particular channel transmitting the signal of the maximum value.

Figure 1:
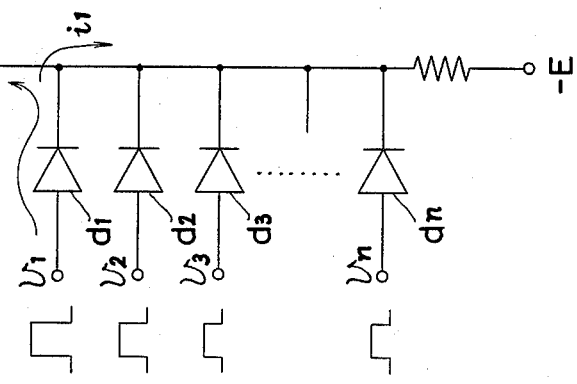
FIG. 1 is a diagram illustrating a commonly used diode OR circuit capable of extracting the signal having the maximum value from a plurality of input potential signals.

First, the operating principle of the OR circuit of diodes which forms one of the essential elements of the present invention and which serves the purpose of extracting the signals of the maximum value from the plurality of input signals being transmitted through as many channels will be described with reference to FIG. 1. Generally, in the digital processing, an OR circuit is intended to issue the output of "1" when any of a plurality of input signals has the binary value of "1." The present invention relies on the OR circuit in the discrimination apparatus to fulfill a function different from the function described above.

It is now assumed that a plurality of electrodes are fastened to as many positions on the head of the subject for the application of the apparatus of this invention to the learning processing aimed at elucidating the mechanism of the nervous system. Through the individual electrodes, electric potentials of brain waves of varying intensity are detected. For the classification of categories to be effected by the extraction of the signal of maximum value from the signals of such varying electric potentials, it is necessary to obtain two pieces of information from these signals. One of them is about the intensity of the signal having the maximum potential and the other is for the indexing of the channel transmitting the particular signal of the maximum potential, as mentioned later. For this purpose, therefore, the OR circuit of diodes described above is utilized for the extraction of the potential of the signal of the maximum value. As illustrated in FIG. 1, the plurality, n, of electrodes detect, for example, potential (EEG) signals $V_1 \sim V_n$ of varying values from the subject's brain and forward them to the input unit of the OR circuit. The potential of the resultant output of the OR circuit equals that of the signal of the maximum value. In this case, the component diodes of the OR circuit function to permit flow of input signals of positive potential, when the electric potential on the anode side of the diode is higher than that on the cathode side thereof. It is assumed at this point that in the plurality of signals $V_1 \sim V_n$ of varying values of potentials given to as many diodes, the signal $V_1$ fed to the diode D, has the maximum potential. Since the electric potential of the signal $V_1$ is higher than that of any of the other signals $V_2 \sim V_n$, an electric current, $i_1$ flows through the diode $d_1$ and that potential of the signal $V_1$ forms a reverse bias with respect to the remaining diodes $d_2 \sim d_n$ and impedes the passing of the remaining signals $V_2 \sim V_n$ therethrough. Consequently, the output signal $V_x$ from this OR circuit has the same potential as the signal $V_1$ which has the maximum potential in all the signals being transmitted through the plurality of channels, but, however, it is incapable of discriminating from among all the channels involved the particular channel which has transmitted the signal of the maximum potential. One embodiment of the present invention which, by using the OR circuit as illustrated in FIG. 2, simultaneously fulfills the functions of extracting the maximum potential and indexing the particular channel which has transmitted the signal of the maximum potential will be described.

Figure 2:
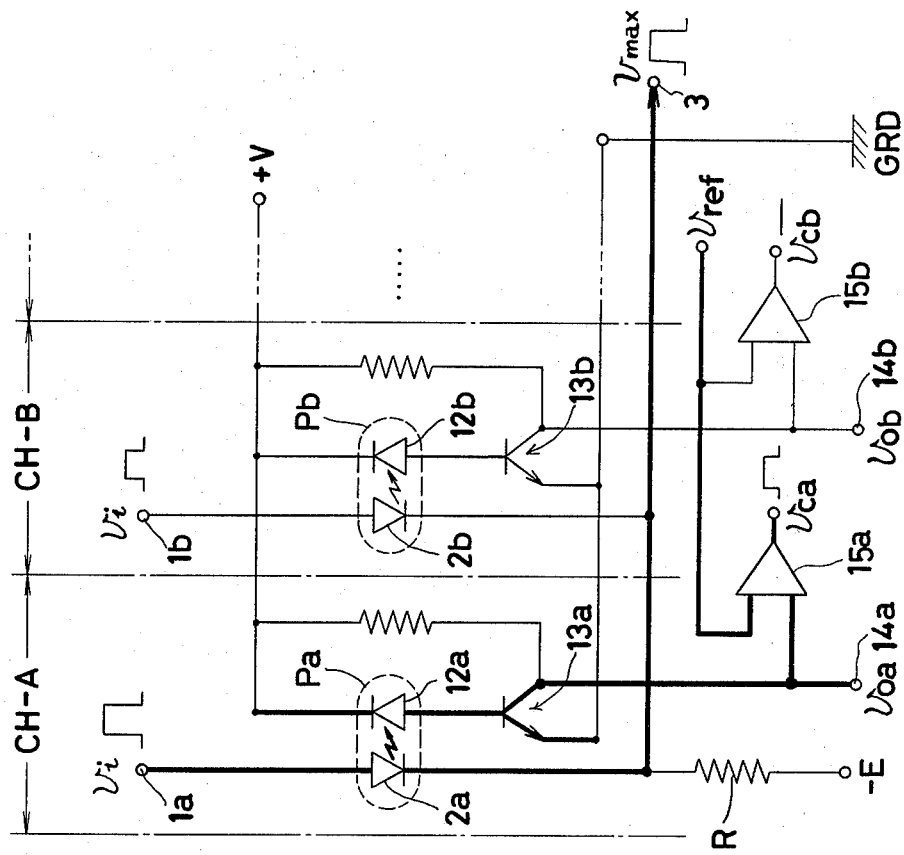
FIG. 2 is a diagram illustrating one preferred embodiment of the discrimination apparatus according to this invention, designed for the indexing of the input channel transmitting the signal of the maximum value among all the input signals involved.

FIG. 2 illustrates only two channels CH-A and CH-B. In the actual configuration of the circuit, as many channels as are involved in the circuit of this class are arranged in parallel connection. All the circuits in the plurality of channels are adapted so as to operate and produce equally the effect to be described below. These channels are provided one each with photocouplers Pa, Pb, . . . composed of the electroluminescent elements (hereinafter referred to as LD's) $2a$, $2b$, . . . such as light-emitting diodes, which constitute an OR circuit and the photoelectric elements $12a$, $12b$ . . . such as photodiodes or phototransistors. From the electrodes $1a$, $1b$, . . . , signals of varying potentials are applied to the individual channels of the OR circuit. It is now assumed that the potential of the signal $V_{ia}$ which is given to the channel CH-A has a larger value than any of the other signals $V_{ib}$, . . . . Then, the LD $2a$ permits the passage of this signal $V_{ia}$. Consequently, the potential of this signal forms a reverse bias with respect to all the other LD's $2b$, . . . and impedes the passage of the other signals $V_{ib}$, . . . through the remaining LD's. As a result, the signal Vmax having the potential of the signal $V_{ia}$ of the maximum potential is issued from the output terminal 3 of this OR circuit.

In the individual channels, the photoelectric elements disposed on the signal-receiving sides of the respective photocouplers are serially connected to the transistors $13a$, $13b$, . . . as switch means to form signal-detection circuits. As many signal-detection circuits as the channels involved herein are arranged in common emitter connection.

The function of the signal-detection circuits is as follows. When the signal $V_{ia}$ having the maximum potential is applied to the channel CH-A, the LD $2a$ alone is caused to emit light and, consequently, the photoelectric element $12a$ is caused to generate photoelectromotive force and operate the transistor $13a$, that is the electric current flows between the emitter and the collector and the corresponding output terminal $14a$ issues the signal $V_{Oa}$. In the other channels CH-B, . . . , since the photoelectric elements $12b$, . . . receive no signal, the signals $V_{Ob}$ . . . issued from their respective output terminals $14b$, . . . have zero potential. This means that these output terminals issue no output. It is now clear that the signal $V_{Oa}$ is issued solely from the electrode $14a$ of the signal-detection circuits. To improve the accuracy for discriminating the maximum signal from the input signals, a comparator 15 for comparing the output from the relative transistor with a preset reference level $V_{ref}$ may be provided on each of the circuits. Though the outputs $V_{Oa}$, $V_{Ob}$ . . . from the transistors are in the form of analogue, the signals can be converted to digital signals $V_{Ca}$, $V_{Cb}$ . . . by means of the comparators thereby to facilitate the processing of the discrimination. Based on this fact, the apparatus is allowed to discriminate from all the channels of the OR circuit the particular channel which has issued the maximum-value output Vmax.

As a possible substitute for the photocoupler used in the present apparatus, one may conceive of a mechanism using a solenoid coil instead of an LD and a reed relay instead of the photoelectric element, because the mechanism instead of the photocoupler provides to transmit the desired signals from the input side to the receiving side. However, this mechanism relies for its operation upon the mechanical actions of the component parts, and therefore, the speed of its operation is quite low and the reliability of its function is inferior. This fact offers good proof that the photocoupler is the optimum choice for the element in the present apparatus by any standard.

According to the principle of circuit configuration which underlies the present invention, the channel discrimination apparatus can be formed in a strikingly simple construction and enables the extraction of the maximum potential and the indexing of the particular channel transmitting that potential to be carried out very easily. Moreover, the intensity of the operating voltage of each LD can freely be fixed by suitable selection of the value of the resistance R offered in the OR circuit, so that the circuit may be prevented from producing a wrong operation in response to the input signal having a high noise content as in the myoelectric potential (EMG).

Figure 3:
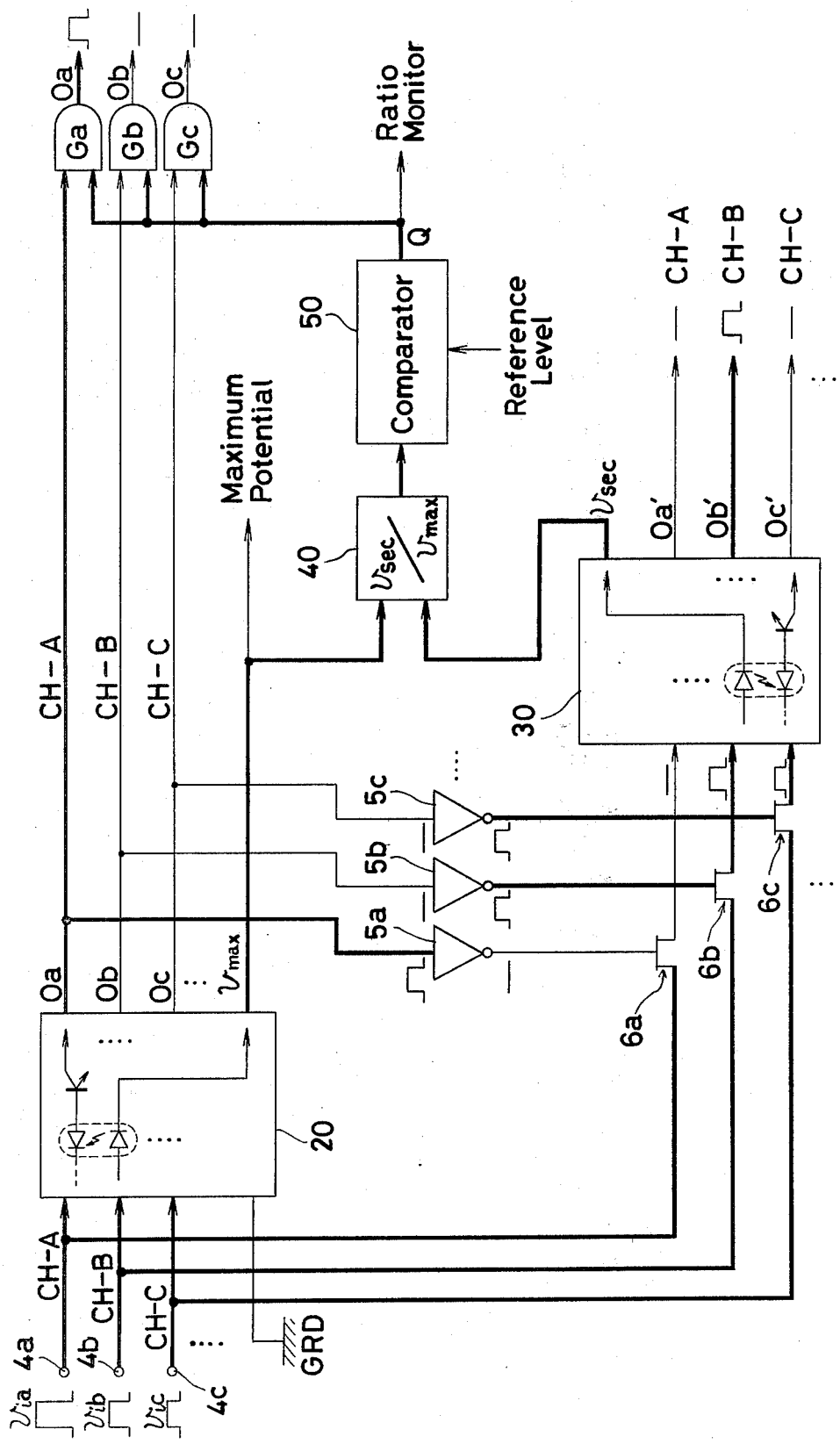
FIG. 3 is a diagram illustrating one preferred embodiment of the channel discrimination apparatus of this invention, designed for the classification of a plurality of categories.

Another embodiment of this invention to be described below is the channel discrimination apparatus of the kind to be used for aiding in the control of an artificial arm with high reliability, for example. In this application, the apparatus enables the various EMG signals issuing from a plurality of muscles of the subject's body to be classified into fixed categories, based on linear discriminant functions, so as to be advantageously used as instruction signals required for the control of motions the artificial arm is expected to produce. In this operation, the apparatus must provide the discrimination with high accuracy. A typical configuration of this apparatus is illustrated in FIG. 3. Now, the processing of data by use of this apparatus will be described in outline below. By this apparatus, the channel transmitting the signal of the maximum potential can be discriminated, without fail, from the remaining channels by comparing the signal showing the second largest potential with the signal showing the maximum potential to determine the ratio of the second largest value to the maximum value and accepting the signal of the maximum value as the discriminating signal for the classification of categories on condition that the ratio is smaller than a certain preset reference value.

In FIG. 3, the input electrodes $4a$, $4b$, $4c$, . . . for the channels CH-A, CH-B, CH-C, . . . are connected to the electrodes fastened to the prescribed positions on the muscles of the subject's body for the detection of EMG signals. These input electrodes receive the potential signals $V_{ia}$, $V_{ib}$, $V_{ic}$, . . . of varying intensity from the respective electrodes fastened to the muscles. The circuits 20, 30 are formed by integrally combining the discrimination circuits of the kind illustrated in FIG. 2. On the assumption that these input signals have potential values of the relationship, $V_{ia} > V_{ib} > V_{ic}$, they are transmitted to the discrimination circuit 20 on one hand and they are, on the other hand, transmitted via analog switches $6a$, $6b$, $6c$ to the discrimination circuit 30.

In accordance with the operating principle described above with reference to FIG. 2, on delivery of the signals $V_i$ to the discrimination circuit 20, the output channel CH-A corresponding to the channel which has received the signal of the maximum potential issues the discrimination signal ($O_a$ in the present case) and all the other output channels issue no output. At the same time, the maximum potential Vmax possessed by that particular signal is issued as the output.

The input signals $V_i$ which have been transmitted to the other discrimination circuit 30 are respectively controlled by the analog switches $6a$, $6b$, . . . . These switches are operated on by the signals which are generated by inverting the output signals Oa, Ob, . . . for the channel discrimination from the circuit 20 by means of the inverters $5a$, $5b$, $5c$, . . . . In other words, the circuit 20 only issues the output signal Oa which corresponds to the channel CH-A, whereas the inverters issue the signals with the exception of the signal corresponding to the channel CH-A. The result is that the corresponding switch $6a$ alone is kept from being turned ON. Consequently, of the input signals, the signal which has been indexed as possessing the maximum potential Vmax in the circuit 20 is prevented from being forwarded to the circuit 30. When the processing described above with reference to FIG. 2 is carried out, the output signal Ob' which is issued consequently from the circuit 30 serves to designate the channel (CH-B in the present case) for the signal of the second largest potential. In the meantime, the circuit 30 issues the potential Vsec of the signal of the second largest value.

In order to determine whether the discrimination signal issued from the circuit 20 can be relied on for the classification of categories, it is necessary to find the ratio of the second largest potential Vsec from the circuit 30 to the maximum potential Vmax from the circuit 20 and then confirm that this ratio is smaller than a preset reference level. For this purpose, therefore, the signal Vmax from the circuit 20 and the signal Vsec from the circuit 30 are subjected to arithmetic operation in the divider 40 to find the aforementioned ratio and the ratio thus determined is compared with the reference level in the comparator 50. The signal Q is issued when the ratio is smaller than the reference level. In the meantime, any one of the discrimination signals Oa, Ob, . . . issued from the circuit 20 is passed through one of the AND gates Ga, Gb, Gc, . . . to give rise to the output of this discrimination apparatus. These gates are opened or closed by the output Q of the comparator 50. In this case, therefore, the discrimination signal Oa alone is issued from the gate Ga because only the signal indexing the channel CH-A is issued from the circuit 20. Besides, the maximum potential Vmax can be extracted for the purpose of confirming the presence of correspondence.

Optionally, the information as to whether the ratio of the signal of the second largest potential to the signal of the maximum potential is amply large for the purpose of indexing can be confirmed by monitoring the output Q of the comparator 50 serving to make the comparison between the two signals mentioned above.

Owing to the circuit configuration described above, the discrimination of channel can be accomplished with high reliability. This circuit configuration can be freely modified in any way so far as the component circuits making up the whole apparatus are allowed to fulfill the functions described above. For example, while in the configuration of FIG. 2, the npn-transistors 13a, 13b, . . . are used, the pnp-transistor can be effectively adopted by reversing the polarity of the photoelectric element 12a. While in the configuration of FIG. 3, the arithmetic circuit is utilized for determining the ratio of the signal Vsec to the signal Vmax, the ratio may be obtained of the signal Vmax to the signal Vsec instead. In the case of such reversed ratio, the gates Ga, Gb, . . . may be adapted so that they will be opened and closed based on the information as to whether this ratio is greater than the reference ratio. Although in the preferred embodiments so far described, all the plurality of channels are used for receiving the input signals of varying potential, the discrimination apparatus of this invention can naturally be utilized similarly effectively in applications in which such signals are transmitted from only one channel.

As is clear from the foregoing description, the present invention by use of a very simple circuit configuration not only permits the signal of the maximum potential to be extracted from signals issuing from the plurality of channels but also enables the channel transmitting the particular signal to be on a real-time basis discriminated and indexed with great ease and high accuracy. Further, it permits the control of delicate motions of artificial limbs and ordinary machine tools to be effected owing to the high accuracy of classification.

What is claimed is:

1. An apparatus for the extraction of the signal of the maximum potential from a plurality of input signals and for the indexing of the particular channel transmitting the signal of the maximum potential, which apparatus comprises a pair of discrimination circuits each composed of a plurality of photocouplers each consisting of an electroluminescent element whose output terminal is connected to the output terminals of the electroluminescent elements of the other photocouplers to form an OR circuit and a photoelectric element adapted to operate to derive an output signal in response to the emission of light from said electroluminescent element, and transistors possessing respective independent output terminals and adapted to generate a switching action in response to the bias applied to the base in consequence of the operation of said photoelectric elements thereby deriving a signal as an output of the discrimination circuits; inverters connected to the output signal of one of the discrimination circuit circuits, analog switches adapted to operate in response to the output signals of said inverters and connected to respective output terminals of the other discrimination circuit; an arithmetic circuit adapted to obtain the ratio between the output signals issued from the two discrimination circuits, comparator adapted to compare the ratio of the two potential signals from the arithmetic circuit with a preset reference level signal; and gates adapted to operate in response to the output of said comparator and permit passage of the output from said one of the discrimination circuits, whereby the potential of the input signal of the maximum potential is extracted through said one of the discrimination circuits and the input channel transmitting that particular signal is indexed, the potential of the input signal of the second largest potential is extracted through the other discrimination circuit and, at the same time, the channel transmitting that particular signal is indexed, and the gate corresponding to the input channel transmitting the signal of the maximum potential issues the channel discrimination signal when the ratio of the two potentials from the two discrimination circuits is found as allowable with respect to the preset reference level signal.

* * * * *